(12) United States Patent
Leng et al.

(10) Patent No.: US 11,608,947 B2
(45) Date of Patent: Mar. 21, 2023

(54) LIGHT BAR, BACKLIGHT ASSEMBLY AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Shouyang Leng, Beijing (CN); Wenyang Li, Beijing (CN); Rui Han, Beijing (CN); Zeyuan Tong, Beijing (CN); Dong Cui, Beijing (CN); Zhipeng Zhang, Beijing (CN); Bin Long, Beijing (CN); Zan Zhang, Beijing (CN); Yue Zhai, Beijing (CN); Dong Guan, Beijing (CN); Weining Chi, Beijing (CN); Fengping Wang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 225 days.

(21) Appl. No.: 16/961,033

(22) PCT Filed: Sep. 19, 2019

(86) PCT No.: PCT/CN2019/106598
§ 371 (c)(1),
(2) Date: Jul. 9, 2020

(87) PCT Pub. No.: WO2021/051334
PCT Pub. Date: Mar. 25, 2021

(65) Prior Publication Data
US 2021/0404613 A1    Dec. 30, 2021

(51) Int. Cl.
F21S 4/24 (2016.01)
F21V 23/00 (2015.01)
(Continued)

(52) U.S. Cl.
CPC .............. *F21S 4/24* (2016.01); *F21V 23/002* (2013.01); *F21V 33/0052* (2013.01); *F21Y 2103/10* (2016.08); *F21Y 2115/10* (2016.08)

(58) Field of Classification Search
CPC ....... F21S 4/24; F21V 23/002; F21V 33/0052
(Continued)

(56) References Cited

U.S. PATENT DOCUMENTS 8,064,006 B2 * 11/2011 Park ................... G02F 1/133608
362/244
8,823,145 B2 *  9/2014 Shin ..................... H05K 1/0206
257/276

(Continued)

FOREIGN PATENT DOCUMENTS

CN        202008021 U    10/2011
CN        102252217 A    11/2011
(Continued)

*Primary Examiner* — Bryon T Gyllstrom
(74) *Attorney, Agent, or Firm* — Dinsmore & Shohl LLP

(57) ABSTRACT

The present disclosure provides a light bar, a backlight assembly and a display device. The light bar includes a substrate; a first metal layer disposed on a first side of the substrate and comprising a plurality of first metal segments disposed at intervals along a length direction of the light bar; a second metal layer disposed on a second side opposite to the first side of the substrate and comprising a plurality of second metal segments disposed at intervals along the length direction of the light bar, a projection of the interval between two adjacent first metal segments on the substrate falls into projections of the second metal segments on the substrate, and a projection of the interval between two adjacent second (Continued)

metal segments on the substrate falls into projections of the first metal segments on the substrate.

16 Claims, 4 Drawing Sheets

(51) Int. Cl.
    *F21V 33/00*     (2006.01)
    *F21Y 103/10*     (2016.01)
    *F21Y 115/10*     (2016.01)

(58) Field of Classification Search
    USPC ........................................................ 362/97.1
    See application file for complete search history.

(56) References Cited

U.S. PATENT DOCUMENTS

| | | | | |
|---|---|---|---|---|
| 9,903,565 | B2* | 2/2018 | Liao | ............... F21V 15/01 |
| 2009/0268434 | A1* | 10/2009 | Mita | ............ G02F 1/133608 |
| | | | | 362/382 |
| 2010/0254117 | A1 | 10/2010 | Hsu et al. | |
| 2013/0049036 | A1* | 2/2013 | Jeong | ................. H01L 27/153 |
| | | | | 257/91 |
| 2013/0215610 | A1 | 8/2013 | Tsai et al. | |
| 2014/0145582 | A1* | 5/2014 | Zhang | .................. H01L 33/62 |
| | | | | 313/45 |
| 2014/0370663 | A1* | 12/2014 | Bayerer | ................ H01L 23/48 |
| | | | | 438/612 |
| 2016/0351481 | A1* | 12/2016 | Kawakita | ......... H01L 23/49582 |
| 2017/0309853 | A1* | 10/2017 | Jang | ....................... H01L 33/46 |

FOREIGN PATENT DOCUMENTS

| | | |
|---|---|---|
| CN | 102637681 | 8/2012 |
| CN | 103256511 A | 8/2013 |
| CN | 105280795 A | 1/2016 |
| CN | 105720063 A | 6/2016 |
| CN | 108550686 A | 9/2018 |
| CN | 109270733 A | 1/2019 |
| CN | 110297356 A | 10/2019 |
| CN | 113597528 A | 11/2021 |

* cited by examiner

US 11,608,947 B2

LIGHT BAR, BACKLIGHT ASSEMBLY AND DISPLAY DEVICE

CROSS REFERENCE TO RELATED APPLICATION

The present application is a U.S. National Stage Application under 35 U.S.C. § 371 of International Patent Application No. PCT/CN2019/106598, filed on Sep. 19, 2019, the disclosure of which is incorporated by reference herein in its entirety.

TECHNICAL FIELD

The disclosure relates to the technical field of display, in particular to a light bar, a backlight assembly and a display device.

BACKGROUND

In the related art of backlight assembly, the backlight assembly includes a flexible circuit board and a light bar. Light-emitting circuits such as LEDs (Light-emitting Diodes) are provided on the light bar. The light-emitting circuits disposed on the light bar are controlled through the flexible circuit board so that the light-emitting circuits emit light.

SUMMARY

According to a first aspect of the embodiments of the present disclosure, there is provided a light bar, comprising: a substrate; a first metal layer disposed on a first side of the substrate, the first metal layer comprises a plurality of first metal segments disposed at intervals along a length direction of the light bar; and a second metal layer disposed on a second side opposite to the first side of the substrate, the second metal layer comprises a plurality of second metal segments disposed at intervals along the length direction of the light bar, wherein a projection of an interval between two adjacent first metal segments on the substrate falls into projections of the second metal segments on the substrate, and a projection of an interval between two adjacent second metal segments on the substrate falls into projections of the first metal segments on the substrate.

In some embodiments, the light bar comprises a plurality of light-emitting circuits disposed on one side of the first metal layer away from the substrate and disposed at intervals along the length direction of the light bar, wherein a projection of each of the light-emitting circuits on the substrate is partially overlapped with a projection of two adjacent first metal segments on the substrate, a first electrode of the each of the light-emitting circuits is electrically connected with one metal segment of the two adjacent first metal segments, and a second electrode of the each of the light-emitting circuits is electrically connected with the other metal segment of the two adjacent first metal segments.

In some embodiments, the plurality of light-emitting circuits are divided into a plurality of light-emitting circuit groups disposed at intervals along the length direction of the light bar, each of the light-emitting circuit groups comprises a plurality of light-emitting circuit subgroups disposed at intervals along the length direction of the light bar, each of the light-emitting circuit subgroups comprises at least two light-emitting circuits disposed at intervals along the length direction of the light bar, and the at least two light-emitting circuits in each of the light-emitting circuit subgroups are connected in series, and different light-emitting circuit subgroups are connected in parallel.

In some embodiments, in the each of the light-emitting circuit subgroups, a first metal segment electrically connected only to a first electrode of one light-emitting circuit is taken as a first terminal of the each of the light-emitting circuit subgroups, and a first metal segment electrically connected only to a second electrode of one light-emitting circuit is taken as a second terminal of the each of the light-emitting circuit subgroups.

In some embodiments, the light bar comprises: a plurality of first metal wires disposed on the first side of the substrate, the plurality of the first metal wires are in one-to-one correspondence with the plurality of the light-emitting circuit groups, each of the first metal wires is electrically connected with the first terminal of each of the light-emitting circuit subgroups in the corresponding light-emitting circuit group; and a plurality of second metal wires disposed on the second side of the substrate, the plurality of second metal wires are in one-to-one correspondence with the plurality of light-emitting circuit subgroups, each of the second metal wires is electrically connected to a third terminal of the corresponding light-emitting circuit subgroup, wherein the third terminal of the light-emitting circuit subgroup is a second metal segment electrically connected to the second terminal of the light-emitting circuit subgroup, wherein a first voltage applied to the plurality of first metal wires is different from a second voltage applied to the plurality of second metal wires.

In some embodiments, the light bar comprises: a plurality of first through holes, each of the first through holes penetrates through one first metal segment, the substrate and one second metal segment, wherein the first metal segment penetrated by the first through hole is not taken as the second terminal of any of the plurality of light-emitting circuit subgroups, and the second metal segment penetrated by the first through hole is not taken as the third terminal of any of the plurality of light-emitting circuit subgroups.

In some embodiments, the light bar comprises: a plurality of second through holes, each of the second through holes penetrates through one first metal segment, the substrate and one second metal segment, wherein the first metal segment penetrated by the second through hole is the second terminal of each of the plurality of light-emitting circuit subgroups, and the second metal segment penetrated by the second through hole is the third terminal of each of the plurality of light-emitting circuit subgroups.

In some embodiments, the second terminal of the light-emitting circuit subgroup is electrically connected to the third terminal of the light-emitting circuit subgroup through at least one second through hole penetrating through the second terminal of the light-emitting circuit subgroup, the substrate, and the third terminal of the light-emitting circuit subgroup.

In some embodiments, the projection of the interval between two adjacent second metal segments on the substrate is not overlapped with the projection of the light-emitting circuit on the substrate.

In some embodiments, a material of the substrate comprises a flexible insulating material.

In some embodiments, a material of the first and a material of the second metal segments comprise copper.

In some embodiments, the lighting circuit is an LED circuit.

According to a second aspect of the embodiments of the present disclosure, there is provided a backlight assembly including a light bar, the light bar comprising: a substrate; a first metal layer disposed on a first side of the substrate, the first metal layer comprises a plurality of first metal segments disposed at intervals along a length direction of the light bar; and a second metal layer disposed on a second side opposite to the first side of the substrate, the second metal layer comprises a plurality of second metal segments disposed at intervals along the length direction of the light bar, wherein a projection of an interval between two adjacent first metal segments on the substrate falls into projections of the second metal segments on the substrate, and a projection of an interval between two adjacent second metal segments on the substrate falls into projections of the first metal segments on the substrate.

In some embodiments, the light bar further comprising: a plurality of light-emitting circuits disposed on one side of the first metal layer away from the substrate and disposed at intervals along the length direction of the light bar, wherein a projection of each of the light-emitting circuits on the substrate is partially overlapped with a projection of two adjacent first metal segments on the substrate, a first electrode of the each of the light-emitting circuits is electrically connected with one metal segment of the two adjacent first metal segments, and a second electrode of the each of the light-emitting circuits is electrically connected with the other metal segment of the two adjacent first metal segments.

In some embodiments, the plurality of light-emitting circuits are divided into a plurality of light-emitting circuit groups disposed at intervals along the length direction of the light bar, each of the light-emitting circuit groups comprises a plurality of light-emitting circuit subgroups disposed at intervals along the length direction of the light bar, each of the light-emitting circuit subgroups comprises at least two light-emitting circuits disposed at intervals along the length direction of the light bar, and the at least two light-emitting circuits in each of the light-emitting circuit subgroups are connected in series, and different light-emitting circuit subgroups are connected in parallel.

In some embodiments, in the each of the light-emitting circuit subgroups, a first metal segment electrically connected only to a first electrode of one light-emitting circuit is taken as a first terminal of the each of the light-emitting circuit subgroups, and a first metal segment electrically connected only to a second electrode of one light-emitting circuit is taken as a second terminal of the each of the light-emitting circuit subgroups.

In some embodiments, the light bar further comprising: a plurality of first metal wires disposed on the first side of the substrate, the plurality of the first metal wires are in one-to-one correspondence with the plurality of the light-emitting circuit groups, each of the first metal wires is electrically connected with the first terminal of each of the light-emitting circuit subgroups in the corresponding light-emitting circuit group; and a plurality of second metal wires disposed on the second side of the substrate, the plurality of second metal wires are in one-to-one correspondence with the plurality of light-emitting circuit subgroups, each of the second metal wires is electrically connected to a third terminal of the corresponding light-emitting circuit subgroup, wherein the third terminal of the light-emitting circuit subgroup is a second metal segment electrically connected to the second terminal of the light-emitting circuit subgroup, wherein a first voltage applied to the plurality of first metal wires is different from a second voltage applied to the plurality of second metal wires.

In some embodiments, the light bar further comprising: a plurality of first through holes, each of the first through holes penetrates through one first metal segment, the substrate and one second metal segment, wherein the first metal segment penetrated by the first through hole is not taken as the second terminal of any of the plurality of light-emitting circuit subgroups, and the second metal segment penetrated by the first through hole is not taken as the third terminal of any of the plurality of light-emitting circuit subgroups.

In some embodiments, the light bar further comprising: a plurality of second through holes, each of the second through holes penetrates through one first metal segment, the substrate and one second metal segment, wherein the first metal segment penetrated by the second through hole is the second terminal of each of the plurality of light-emitting circuit subgroups, and the second metal segment penetrated by the second through hole is the third terminal of each of the plurality of light-emitting circuit subgroups.

According to a third aspect of the embodiments of the present disclosure, there is provided a display device including the backlight assembly according to any one of the embodiments described above.

Other features of the present disclosure and advantages thereof will become apparent from the following detailed description of exemplary embodiments thereof, which proceeds with reference to the accompanying drawings.

BRIEF DESCRIPTION OF THE DRAWINGS

The accompanying drawings, which are incorporated in and constitute a part of this specification, illustrate embodiments of the disclosure and together with the description, serve to explain the principles of the disclosure.

The present disclosure may be more clearly understood from the following detailed description taken in conjunction with the accompanying drawings, in which.

It should be understood that the dimensions of the various parts shown in the drawings are not drawn according to the actual proportional relationship. Further, the same or similar reference numerals denote the same or similar components.

DETAILED DESCRIPTION

Figure 1:
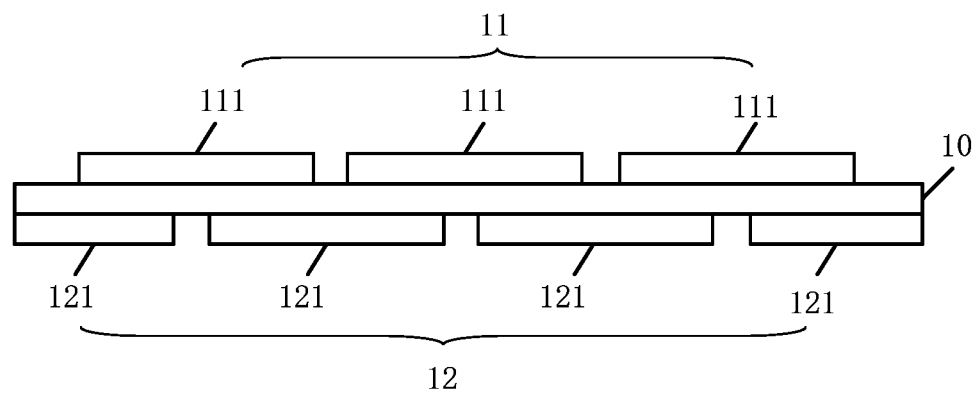
FIG. 1 is a schematic structural view of a light bar according to one embodiment of the present disclosure.

Various exemplary embodiments of the present disclosure will now be described in detail with reference to the accompanying drawings. The description of the exemplary embodiments is merely illustrative and is in no way intended to limit the disclosure, its application, or uses. The present disclosure may be embodied in many different forms and is not limited to the embodiments described herein. These embodiments are provided so that this disclosure will be thorough and complete, and will fully convey the scope of the disclosure to those skilled in the art. It should be noted that: the relative arrangement of parts and steps, the composition of materials and values set forth in these embodiments are to be construed as illustrative only and not as limiting unless otherwise specifically stated.

The use of "first", "second", and similar words in this disclosure is not intended to indicate any order, quantity, or importance, but rather is used to distinguish one element from another. The word "comprise" or "include", and the like, means that the element preceding the word comprises the element listed after the word, and does not exclude the possibility that other elements may also be included.

All terms (including technical or scientific terms) used herein have the same meaning as commonly understood by one of ordinary skill in the art to which this disclosure belongs unless specifically defined otherwise. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Techniques, methods, and apparatus known to one of ordinary skill in the relevant art may not be discussed in detail but are intended to be part of the specification where appropriate.

In the related art, a plurality of metal segments are respectively disposed on two sides of a substrate in a light bar at intervals along a length direction of the light bar. On one side of the substrate, the light-emitting circuit is electrically connected with two adjacent metal segments. Because there is an interval between the two metal segments, the short circuit of the light-emitting circuit is effectively avoided.

In the related art, a substrate is provided in a light bar. A first side of the substrate is provided with a first metal layer, and a second side of the substrate is provided with a second metal layer. A light-emitting circuit is disposed on the first metal layer. In order to avoid short circuit among the light-emitting circuits, the first metal layer is divided into a plurality of first metal segments which are disposed at intervals along the length direction of the light bar. In addition, the second metal layer is divided into a plurality of second metal segments which are disposed according to the length direction of the light bar. A first voltage is applied to the corresponding first metal segments and a second voltage is applied to the corresponding second metal segments so as to make the light-emitting circuit operate normally.

The inventors found through research that a first projection of an interval between two adjacent first metal segments disposed on a first side of a substrate on the substrate generally overlaps with a second projection of an interval between two adjacent metal segments disposed on a second side of the substrate on the substrate. Because the first projection and the second projection are overlapped, the thickness of the light bar in the partial area is thinner, and the intensity is reduced. In case of external force, the light bar is easy to crack in this area.

In view of the above, the disclosure provides a solution for effectively avoiding the light bar to crack.

FIG. 1 is a schematic structural view of a light bar according to one embodiment of the present disclosure. As shown in FIG. 1, the light bar includes a substrate 10, a first metal layer 11 and a second metal layer 12.

A first metal layer 11 is disposed on a first side of the substrate 10. The first metal layer 11 includes a plurality of first metal segments 111. The plurality of first metal segments 111 are disposed at intervals along the length direction of the light bar 10. A second metal layer 12 is disposed on a second side opposite to the first side of the substrate. The second metal layer 12 includes a plurality of second metal segments 121. The plurality of second metal segments 121 are disposed at intervals along the length direction of the light bar.

In some embodiments, a material of the substrate is a flexible insulating material. Such as PI (polyimide) material or other material having flexible insulating properties.

In some embodiments, a material of the first and a material of the second metal segments comprises copper, or other suitable metallic material.

Figure 2:
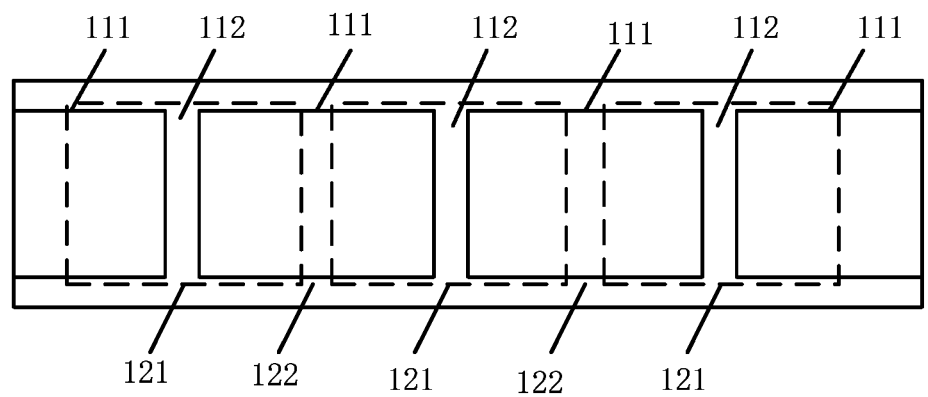
FIG. 2 is a top view of the light bar of FIG. 1.

FIG. 2 is a top view of the light bar shown in FIG. 1.

As shown in FIG. 2, a projection of an interval 112 between two adjacent first metal segments 111 on the substrate falls into a projection of a second metal segment 112 on the substrate 10. A projection of the interval 122 between two adjacent second metal segments 121 on the substrate 10 falls into a projection of a first metal segment 111 on the substrate 10.

In the light bar provided by the above embodiment of the present disclosure, the position of the interval between the adjacent metal segments is adjusted, so that the projection of the interval between two adjacent first metal segments disposed on one side of the substrate on the substrate is prevented from overlapping with the projection of the interval between two adjacent second metal segments disposed on the other side of the substrate on the substrate. Therefore, the intensity of the light bar in any region cannot be reduced, and the possibility of breakage of the light bar is effectively reduced.

Figure 3:
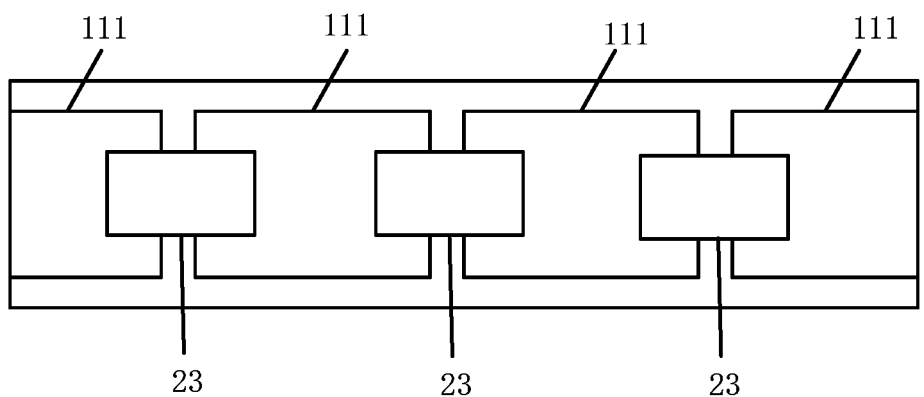
FIG. 3 is a schematic view of a structure of a light bar according to another embodiment of the present disclosure.

FIG. 3 is a schematic view of a structure of a light bar according to another embodiment of the present disclosure.

As shown in FIG. 3, the light bar includes a plurality of light-emitting circuits 23. The plurality of light-emitting circuits 23 are disposed on one side of the first metal layer 11 away from the substrate 10. The plurality of light-emitting circuits 23 are disposed at intervals along a length direction of the light bar. A projection of each of the light-emitting circuit 23 on the substrate 10 partially overlaps projections of the adjacent two first metal segments 111 on the substrate 10. A first electrode of each of the light-emitting circuit 23 is electrically connected to one of the adjacent two first metal segments, and a second electrode of each of the light-emitting circuit 23 is electrically connected to the other of the adjacent two first metal segments.

In some embodiments, the light-emitting circuit is an LED circuit. For example, the light-emitting circuit is an LED bead.

In some embodiments, the plurality of light-emitting circuits in the light bar are divided into a plurality of light-emitting circuit groups. A plurality of light-emitting circuit groups are disposed at intervals along the length direction of light bar. Each of the light-emitting circuit groups comprises a plurality of light-emitting circuit subgroups which are disposed at intervals along the length direction of the light bar. Each of the light-emitting circuit subgroups comprises at least two light-emitting circuits which are disposed at intervals along the length direction of the light bar.

Figure 4:
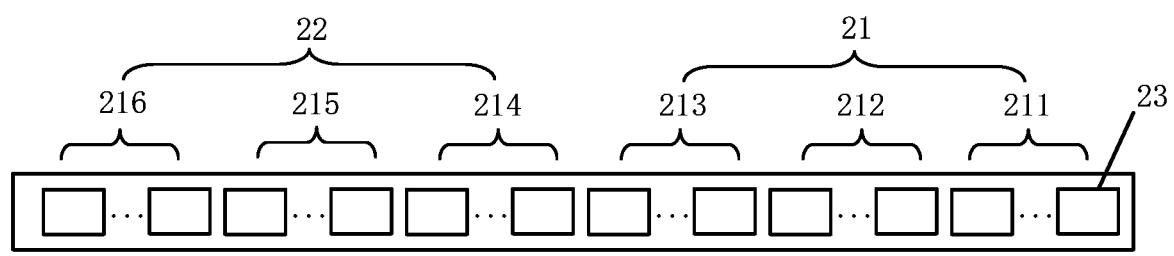
FIG. 4 is a schematic structural view of a light bar according to another embodiment of the present disclosure.

FIG. 4 is a schematic structural view of a light bar according to another embodiment of the present disclosure.

As shown in FIG. 4, the light bar includes 2 light-emitting circuit groups 21 and 22. The light-emitting circuit group 21 includes 3 light-emitting circuit subgroups 211, 212 and 213, and the light-emitting circuit group 22 includes 3 light-emitting circuit subgroups 214, 215 and 216. Each of the light-emitting circuit subgroups includes at least two light-emitting circuits 23 connected in series.

Figure 5:
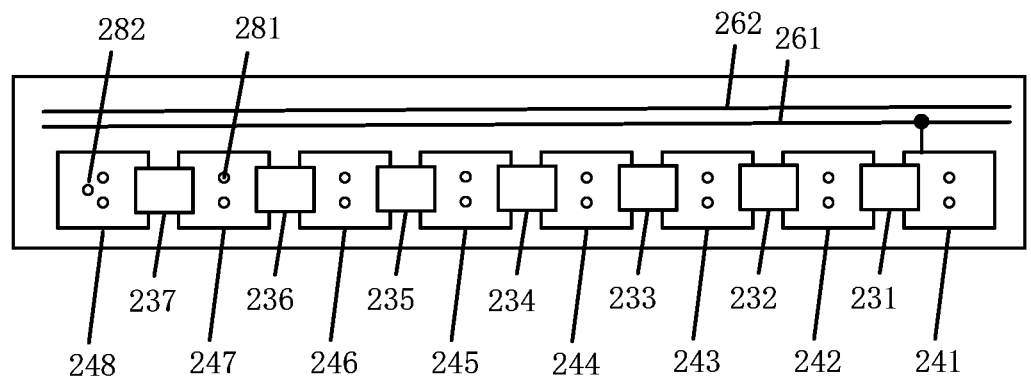
FIG. 5 is a partially enlarged schematic view of the light bar shown in FIG. 4.

FIG. 5 is a partially enlarged schematic view of the light bar shown in FIG. 4. As an example, FIG. 5 shows a specific structure of the light-emitting circuit subgroup 211.

As shown in FIG. 5, 7 light-emitting circuits 231-237 are included in the light-emitting circuit sub-group 211. The projection of each of the light-emitting circuits on the substrate 10 partially overlaps the projections of the two adjacent first metal segments on the substrate, the first electrode of each of the light-emitting circuit is electrically connected to one metal segment of the two adjacent first metal segments, and the second electrode of each of the light-emitting circuit is electrically connected to the other metal segment of the two adjacent first metal segments.

For example, as shown in FIG. 5, the first electrode of the light-emitting circuit 231 is electrically connected to the adjacent first metal segment 241, and the second electrode of the light-emitting circuit 231 is electrically connected to the adjacent first metal segment 242. The first electrode of the light-emitting circuit 232 is electrically connected to the adjacent first metal segment 242, and the second electrode of the light-emitting circuit 232 is electrically connected to the adjacent first metal segment 243. The first electrode of the light-emitting circuit 233 is electrically connected to the adjacent first metal segment 243, and the second electrode of the light-emitting circuit 233 is electrically connected to the adjacent first metal segment 244. The first electrode of the light-emitting circuit 234 is electrically connected to the adjacent first metal segment 244, and the second electrode of the light-emitting circuit 234 is electrically connected to the adjacent first metal segment 245. The first electrode of the light-emitting circuit 235 is electrically connected to the adjacent first metal segment 245, and the second electrode of the light-emitting circuit 235 is electrically connected to the adjacent first metal segment 246. The first electrode of the light-emitting circuit 236 is electrically connected to the adjacent first metal segment 246, and the second electrode of the light-emitting circuit 236 is electrically connected to the adjacent first metal segment 247. A first electrode of the light-emitting circuit 237 is electrically connected to the adjacent first metal segment 247, and a second electrode of the light-emitting circuit 237 is electrically connected to the adjacent first metal segment 248, thereby achieving the series connection of the light-emitting circuits 231-237.

Here, the first metal segment 241 electrically connected only to the first electrode of the light-emitting circuit 231 is taken as the first terminal of the light-emitting circuit subgroup 211, and the first metal segment 248 electrically connected only to the second electrode of the light-emitting circuit 237 is taken as the second terminal of the light-emitting circuit subgroup 211. Since the light-emitting circuits 231-237 are connected in series, the light-emitting circuit subgroup 211 connected in series is normally operated by applying a positive voltage to the first terminal of the light-emitting circuit subgroup 211 and a negative voltage to the second terminal of the light-emitting circuit subgroup 211.

It should be noted that, since the other light-emitting circuit subgroups have the same structure as the light-emitting circuit subgroup 211, the detailed description thereof is omitted.

In some embodiments, the light bar further includes a plurality of first metal wires disposed on the first side of the substrate. The plurality of first metal wires are in one-to-one correspondence with the plurality of light-emitting circuit groups. Each of the first metal wires is electrically connected with the first terminal of each of the light-emitting circuit subgroup in the corresponding light-emitting circuit group. The light bar further comprises a plurality of second metal wires disposed on the second side of the substrate. The plurality of second metal wires are in one-to-one correspondence with the plurality of light-emitting circuit subgroups, and each of the second metal wires is electrically connected with a third terminal of the corresponding light-emitting circuit subgroup. The third terminal of the light-emitting circuit subgroup is a second metal segment electrically connected with the second terminal of the light-emitting circuit subgroup. A first voltage is applied to the first metal wires, and a second voltage is applied to the second metal wires, and the first voltage is different from the second voltage, so that a closed loop is realized.

For example, as shown in FIG. 5, 2 light-emitting circuit groups are disposed on the light bar, 2 first metal wires, i.e., first metal wires 261 and 262, are disposed on the first side of the substrate 10. The first metal wire 261 corresponds to the light-emitting circuit group 21. The first metal wire 261 is electrically connected to the first terminal of the light-emitting circuit subgroup 211 in the light-emitting circuit group 21. The second terminal of the light-emitting circuit subgroup 211 is electrically connected to the third terminal of the light-emitting circuit subgroup 211 disposed at the second side of the substrate 10.

Figure 6:
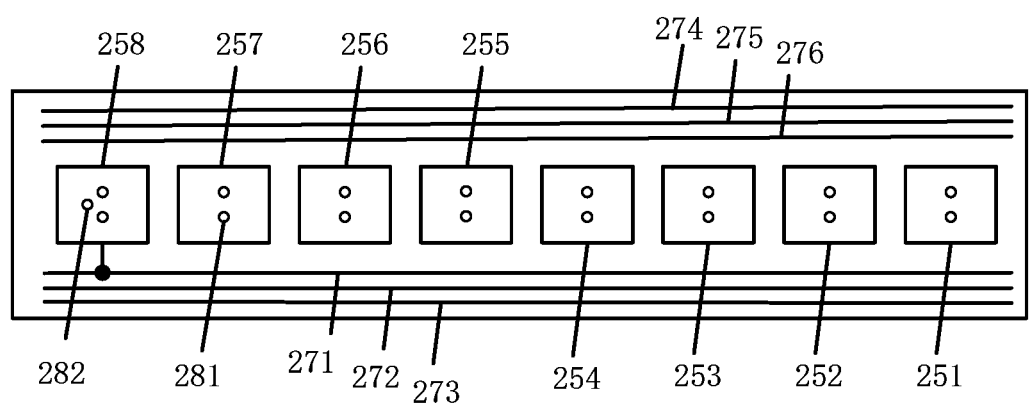
FIG. 6 is a bottom view of the light bar of FIG. 5.

FIG. 6 is a bottom view of the light bar of FIG. 5.

As shown in FIG. 6, the light bar is provided with 6 light-emitting circuit subgroups, 6 second metal wires, i.e., second metal wires 271-276, are disposed on the second side of the substrate 10. The second metal wire 271 is electrically connected to the second metal segment 258 as the third terminal of the light-emitting circuit subgroup 211.

In some embodiments, the light bar further comprises a plurality of first through holes. Each of the first through holes penetrates through one first metal segment, the substrate, and one second metal segment. The first metal segment penetrated by the first through hole is not taken as the second terminal of any one of the light-emitting circuit subgroups, and the second metal segment penetrated by the first through hole is not taken as the third terminal of any one of the light-emitting circuit subgroups.

For example, as shown in FIG. 5, the first metal segment 241-247 do not taken as the second terminal of the light-emitting circuit subgroup 211. As shown in FIG. 6, the second metal segment 251-257 do not taken as the third terminal of the light-emitting circuit subgroup 211. Therefore, a plurality of first through holes 281 may be disposed on the first metal segments 241-247 and the second metal segments 251-257 for heat dissipation.

In some embodiments, the light bar further comprises a plurality of second through holes. Each of the second through holes penetrates through one first metal segments, the substrate, and one second metal segments. The first metal segment penetrated by the second through hole is a second terminal of one of the light-emitting circuit subgroups, and the second metal segment penetrated by the second through hole is a third terminal of one of the plurality light-emitting circuit subgroups.

For example, as shown in FIG. 5, the first metal segment 248 serves as a second terminal of the light-emitting circuit subgroup 211. As shown in FIG. 6, the second metal segment 258 serves as a third terminal of the light-emitting circuit subgroup 211. A plurality of second through holes 282 are disposed on the first metal segment 248 and the second metal segment 258, so that the second terminal and the third terminal of the light-emitting circuit subgroups 211 are electrically connected through the second through holes 282.

Figure 7:
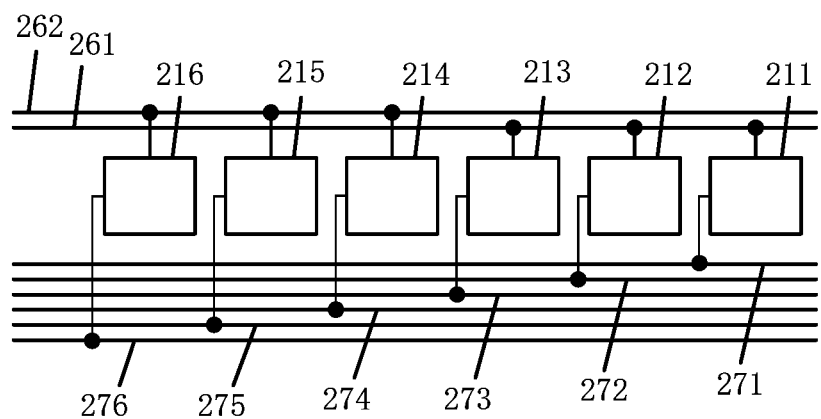
FIG. 7 is a schematic diagram of electrical connection of a light-emitting circuit subgroup according to one embodiment of the present disclosure.

FIG. 7 is a schematic diagram of electrical connection of a light-emitting circuit subgroup according to one embodiment of the present disclosure.

As shown in FIG. 7, 2 light-emitting circuit groups are disposed on the light bar, and each of the light-emitting circuit groups includes 3 light-emitting circuit subgroups, the first metal wires 261 and 262 are disposed on the first side of the substrate 10. The second metal wires 271-276 are disposed on the second side of the substrate 10.

The first metal wire 261 is electrically connected to the first terminals of the light-emitting circuit subgroups 211-213, respectively, and the second terminal of the light-emitting circuit subgroup 211 is electrically connected to the third terminal of the light-emitting circuit subgroup 211 disposed on the second side of the substrate 10 through the corresponding second through holes. Since the third terminal of the light-emitting circuit substrate 211 is electrically connected to the second metal wire 271, the light-emitting circuits connected in series in the light-emitting circuit subgroup 211 can operate normally. The second terminal of the light-emitting circuit subgroup 212 is electrically connected with the third terminal of the light-emitting circuit subgroup 212 disposed at the second side of the substrate 10 through the corresponding second through holes. Since the third terminal of the light-emitting circuit subgroup 212 is electrically connected to the second metal wire 272, the light-emitting circuits connected in series in the light-emitting circuit subgroup 212 can operate normally. The second terminal of the light-emitting circuit subgroup 213 is electrically connected to the third terminal of the light-emitting circuit subgroup 213 disposed at the second side of the substrate 10 through the corresponding second through holes. Since the third terminal of the light-emitting circuit subgroup 213 is electrically connected to the second metal wire 273, the light-emitting circuits connected in series in the light-emitting circuit subgroup 213 can operate normally.

The second metal wire 262 is electrically connected to the first terminals of the light-emitting circuit subgroups 214-216, respectively, and the second terminal of the light-emitting circuit subgroup 214 is electrically connected to the third terminal of the light-emitting circuit subgroup 214 disposed on the second side of the substrate 10 through the corresponding second through holes. Since the third terminal of the light-emitting circuit subgroup 214 is electrically connected to the second metal wire 274, the light-emitting circuits connected in series in the light-emitting circuit subgroup 214 can operate normally. The second terminal of the light-emitting circuit subgroup 215 is electrically connected to the third terminal of the light-emitting circuit subgroup 215 disposed at the second side of the substrate 10 through a corresponding through holes. Since the third terminal of the light-emitting circuit subgroup 215 is electrically connected to the second metal wire 275, the light-emitting circuits connected in series in the light-emitting circuit subgroup 215 can operate normally. The second terminal of the light-emitting circuit subgroup 216 is electrically connected to the third terminal of the light-emitting circuit subgroup 216 disposed at the second side of the substrate 10 through a corresponding through holes. Since the third terminal of the light-emitting circuit subgroup 216 is electrically connected to the second metal wire 276, the light-emitting circuits connected in series in the light-emitting circuit subgroup 216 can operate normally.

It follows that the light-emitting circuits disposed in each of the light-emitting circuit subgroups are connected in series. The light-emitting circuit subgroups are connected in parallel. Therefore, the light-emitting circuits in the corresponding areas in the light bar can be effectively selected to emit light.

Figure 8:
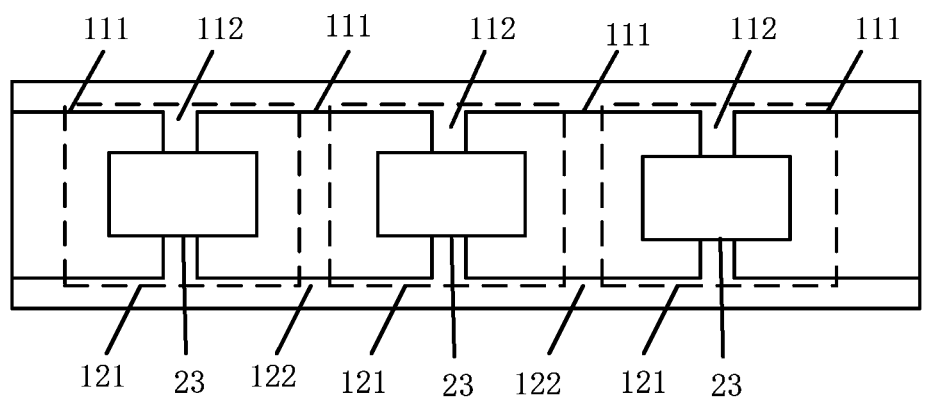
FIG. 8 is a schematic top view of a light bar according to another embodiment of the present disclosure.

FIG. 8 is a schematic top view of a light bar according to another embodiment of the present disclosure. For ease of understanding, FIG. 8 is a perspective view of the light bar.

As shown in FIG. 8, the projection of the interval 112 between two adjacent first metal segments 111 on the substrate falls into the projection of the second metal segment 112 on the substrate 10. The projection of the interval 122 between two adjacent second metal segments 121 on the substrate 10 falls into the projection of the first metal segment 111 on the substrate 10. The projection of the light-emitting circuit 23 on the substrate 10 partially overlaps with the projection of two adjacent first metal segments on the substrate 10. The projection of the interval between two adjacent second metal segments 121 on the substrate does not overlap with the projection of the light-emitting circuit 23 on the substrate.

It should be noted that, for simplicity, through holes penetrating through the substrate, the first metal segment and the second metal segment are not shown in the embodiment shown in FIG. 8.

In the light bar provided by the above embodiment of the present disclosure, by adjusting the position of the interval between the adjacent metal segments, the short circuit of the light-emitting circuit is effectively avoided, the intensity of the light bar in any region can be ensured not to be reduced, and the possibility of breakage of the light bar is effectively reduced.

The present disclosure also provides a backlight assembly. The background assembly may include a light bar as provided in any of the embodiments of FIGS. 1-5.

The present disclosure also provides a display device, which may include the display panel provided in any of the above embodiments. The display device can be any product or component with a display function, such as a display, a mobile phone, a tablet personal computer, a television, a notebook computer, a digital photo frame, a navigator and the like.

In some embodiments, the display device provided by the present disclosure is used as an in-vehicle display device. Because in-vehicle display device can effectively avoid the breaking of the light bar because of the external force, the security of driving can be promoted effectively.

So far, embodiments of the present disclosure have been described in detail. Some details well known in the art have not been described in order to avoid obscuring the concepts of the present disclosure. Those skilled in the art can now fully appreciate how to implement the teachings disclosed herein, in view of the foregoing description.

Although some specific embodiments of the present disclosure have been described in detail by way of example, it should be understood by those skilled in the art that the above examples are for illustration only and are not intended to limit the scope of the present disclosure. It will be understood by those skilled in the art that various changes may be made and equivalents may be substituted for elements thereof without departing from the scope and spirit of the present disclosure. The scope of the present disclosure is defined by the appended claims.

What is claimed is:

1. A light bar, comprising:
a substrate;

a first metal layer disposed on a first side of the substrate, the first metal layer comprising a plurality of first metal segments disposed at intervals along a length direction of the light bar;

a second metal layer disposed on a second side opposite to the first side of the substrate, the second metal layer comprising a plurality of second metal segments disposed at intervals along the length direction of the light bar, wherein a projection of an interval between two adjacent first metal segments on the substrate falls into projections of the second metal segments on the substrate, and a projection of an interval between two adjacent second metal segments on the substrate falls into projections of the first metal segments on the substrate; and a plurality of light-emitting circuits disposed on one side of the first metal layer away from the substrate and disposed at intervals along the length direction of the light bar, wherein a projection of each of the light-emitting circuits on the substrate is partially overlapped with a projection of two adjacent first metal segments on the substrate, a first electrode of the each of the light-emitting circuits is electrically connected with one metal segment of the two adjacent first metal segments, and a second electrode of the each of the light-emitting circuits is electrically connected with the other metal segment of the two adjacent first metal segments, wherein the plurality of light-emitting circuits are divided into a plurality of light-emitting circuit groups disposed at intervals along the length direction of the light bar, each of the light-emitting circuit groups comprises a plurality of light-emitting circuit subgroups disposed at intervals along the length direction of the light bar, each of the light-emitting circuit subgroups comprises at least two light-emitting circuits disposed at intervals along the length direction of the light bar; and the at least two light-emitting circuits in each of the light-emitting circuit subgroups are connected in series, and different light-emitting circuit subgroups are connected in parallel.

2. The light bar according to claim 1, wherein in the each of the light-emitting circuit subgroups, a first metal segment electrically connected only to a first electrode of one light-emitting circuit is taken as a first terminal of the each of the light-emitting circuit subgroups, and a first metal segment electrically connected only to a second electrode of one light-emitting circuit is taken as a second terminal of the each of the light-emitting circuit subgroups.

3. The light bar according to claim 2, further comprising:

a plurality of first metal wires disposed on the first side of the substrate, the plurality of the first metal wires are in one-to-one correspondence with the plurality of the light-emitting circuit groups, each of the first metal wires is electrically connected with the first terminal of each of the light-emitting circuit subgroups in the corresponding light-emitting circuit group; and a plurality of second metal wires disposed on the second side of the substrate, the plurality of second metal wires are in one-to-one correspondence with the plurality of light-emitting circuit subgroups, each of the second metal wires is electrically connected to a third terminal of the corresponding light-emitting circuit subgroup, wherein the third terminal of the light-emitting circuit subgroup is a second metal segment electrically connected to the second terminal of the light-emitting circuit subgroup, wherein a first voltage applied to the plurality of first metal wires is different from a second voltage applied to the plurality of second metal wires.

4. The light bar according to claim 3, further comprising:

a plurality of first through holes, each of the first through holes penetrates through one first metal segment, the substrate and one second metal segment, wherein the first metal segment penetrated by the first through hole is not taken as the second terminal of any of the plurality of light-emitting circuit subgroups, and the second metal segment penetrated by the first through hole is not taken as the third terminal of any of the plurality of light-emitting circuit subgroups.

5. The light bar according to claim 3, further comprising:

a plurality of second through holes, each of the second through holes penetrates through one first metal segment, the substrate and one second metal segment, wherein the first metal segment penetrated by the second through hole is the second terminal of each of the plurality of light-emitting circuit subgroups, and the second metal segment penetrated by the second through hole is the third terminal of each of the plurality of light-emitting circuit subgroups.

6. The light bar according to claim 5, wherein the second terminal of the light-emitting circuit subgroup is electrically connected to the third terminal of the light-emitting circuit subgroup through at least one second through hole penetrating through the second terminal of the light-emitting circuit subgroup, the substrate, and the third terminal of the light-emitting circuit subgroup.

7. The light bar according to claim 1, wherein the projection of the interval between two adjacent second metal segments on the substrate is not overlapped with the projection of the light-emitting circuit on the substrate.

8. The light bar according to claim 1, wherein a material of the substrate comprises a flexible insulating material.

9. The light bar according to claim 1, wherein a material of the first and a material of the second metal segments comprise copper.

10. The light bar according to claim 1, wherein the lighting circuit is an LED circuit.

11. A backlight assembly, comprising a light bar, the light bar comprising:

a substrate;

a first metal layer disposed on a first side of the substrate, the first metal layer comprising a plurality of first metal segments disposed at intervals along a length direction of the light bar;

a second metal layer disposed on a second side opposite to the first side of the substrate, the second metal layer comprising a plurality of second metal segments disposed at intervals along the length direction of the light bar, wherein a projection of an interval between two adjacent first metal segments on the substrate falls into projections of the second metal segments on the substrate, and a projection of an interval between two adjacent second metal segments on the substrate falls into projections of the first metal segments on the substrate; and a plurality of light-emitting circuits disposed on one side of the first metal layer away from the substrate and disposed at intervals along the length direction of the light bar, wherein a projection of each of the light-emitting circuits on the substrate is partially overlapped with a projection of two adjacent first metal segments on the substrate, a first electrode of the each of the light-emitting circuits is electrically connected with one metal segment of the two adjacent first metal segments, and a second electrode of the each of the light-emitting circuits is electrically connected with the other metal segment of the two adjacent first metal segments, the plurality of light-emitting circuits are divided into a plurality of light-emitting circuit groups disposed at intervals along the length direction of the light bar, each of the light-emitting circuit groups comprises a plurality of light-emitting circuit subgroups disposed at intervals along the length direction of the light bar, each of the light-emitting circuit subgroups comprises at least two light-emitting circuits disposed at intervals along the length direction of the light bar; and the at least two light-emitting circuits in each of the light-emitting circuit subgroups are connected in series, and different light-emitting circuit subgroups are connected in parallel.

12. A display device, comprising the backlight assembly of claim 11.

13. The backlight assembly according to claim 11, wherein in the each of the light-emitting circuit subgroups, a first metal segment electrically connected only to a first electrode of one light-emitting circuit is taken as a first terminal of the each of the light-emitting circuit subgroups, and a first metal segment electrically connected only to a second electrode of one light-emitting circuit is taken as a second terminal of the each of the light-emitting circuit subgroups.

14. The backlight assembly according to claim 13, the light bar further comprising:

a plurality of first metal wires disposed on the first side of the substrate, the plurality of the first metal wires are in one-to-one correspondence with the plurality of the light-emitting circuit groups, each of the first metal wires is electrically connected with the first terminal of each of the light-emitting circuit subgroups in the corresponding light-emitting circuit group; and a plurality of second metal wires disposed on the second side of the substrate, the plurality of second metal wires are in one-to-one correspondence with the plurality of light-emitting circuit subgroups, each of the second metal wires is electrically connected to a third terminal of the corresponding light-emitting circuit subgroup, wherein the third terminal of the light-emitting circuit subgroup is a second metal segment electrically connected to the second terminal of the light-emitting circuit subgroup, wherein a first voltage applied to the plurality of first metal wires is different from a second voltage applied to the plurality of second metal wires.

15. The backlight assembly according to claim 14, the light bar further comprising:

a plurality of first through holes, each of the first through holes penetrates through one first metal segment, the substrate and one second metal segment, wherein the first metal segment penetrated by the first through hole is not taken as the second terminal of any of the plurality of light-emitting circuit subgroups, and the second metal segment penetrated by the first through hole is not taken as the third terminal of any of the plurality of light-emitting circuit subgroups.

16. The backlight assembly according to claim 14, the light bar further comprising:

a plurality of second through holes, each of the second through holes penetrates through one first metal segment, the substrate and one second metal segment, wherein the first metal segment penetrated by the second through hole is the second terminal of each of the plurality of light-emitting circuit subgroups, and the second metal segment penetrated by the second through hole is the third terminal of each of the plurality of light-emitting circuit subgroups.

* * * * *